(12) United States Patent
Chang et al.

(10) Patent No.: US 8,909,504 B2
(45) Date of Patent: Dec. 9, 2014

(54) COMPUTING DEVICE, STORAGE MEDIUM AND METHOD FOR PROCESSING DIMENSION NUMBERS USING THE COMPUTING DEVICE

(75) Inventors: Chih-Kuang Chang, New Taipei (TW);
Xin-Yuan Wu, Shenzhen (CN);
Jin-Gang Rao, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 349 days.

(21) Appl. No.: 13/433,380

(22) Filed: Mar. 29, 2012

(65) Prior Publication Data
US 2013/0103361 A1    Apr. 25, 2013

(30) Foreign Application Priority Data
Oct. 20, 2011  (CN) .......................... 2011 1 0321048

(51) Int. Cl.
*G06T 19/00* (2011.01)
*G06K 9/00* (2006.01)
*G06F 17/50* (2006.01)

(52) U.S. Cl.
CPC ............... *G06F 17/50* (2013.01); *G06T 19/00* (2013.01); *G06K 9/00476* (2013.01); *G06T 2210/12* (2013.01); *G06T 2219/012* (2013.01)
USPC ................................... 703/2; 703/6; 715/273

(58) Field of Classification Search
CPC ............................. G06F 17/50; G06F 17/212
USPC ............................................ 703/2, 6; 715/273
See application file for complete search history.

(56) References Cited

U.S. PATENT DOCUMENTS

| | | | |
|---|---|---|---|
| 7,320,104 B2* | 1/2008 | Lynn et al. ..................... | 715/256 |
| 7,546,602 B2* | 6/2009 | Hejlsberg et al. ............. | 719/313 |
| 8,161,384 B2* | 4/2012 | Atkins et al. .................. | 715/273 |
| 2003/0229856 A1* | 12/2003 | Lynn et al. .................... | 715/517 |
| 2010/0275152 A1* | 10/2010 | Atkins et al. .................. | 715/788 |

\* cited by examiner

*Primary Examiner* — Thai Phan
(74) *Attorney, Agent, or Firm* — Novak Druce Connolly Bove + Quigg LLP

(57) ABSTRACT

A method for processing dimension numbers using a computing device, a first template of a dimension frame and a plurality of second templates of dimension numbers 0-9, and a numerical text data of each second template are established. A plurality of block objects are obtained by grouping all discontinuous line segments in the engineering drawing. All frame objects in the engineering drawing are obtained by matching each of the block objects with the first template. One or more remainder objects in each bounding box are obtained, and grouped to obtain one or more number objects in each of the frame objects. A matched second template of each of the number objects is obtained by matching each of the number objects with each of the second templates. The number objects in each of the frame objects are replaced by corresponding numerical text data.

18 Claims, 6 Drawing Sheets

COMPUTING DEVICE, STORAGE MEDIUM AND METHOD FOR PROCESSING DIMENSION NUMBERS USING THE COMPUTING DEVICE

BACKGROUND

1. Technical Field

The present disclosure relates to data process devices and methods, and more particularly to a computing device, a storage medium and a method for processing dimension numbers using the computing device.

2. Description of Related Art

An engineering drawing (e.g. a Computer Aided Design engineering drawing) of a workpiece includes a plurality of dimension numbers. Generally, it is difficult to extract the dimension numbers from the engineering drawing because the dimension numbers consists of discontinuous line segments. Users need to replace discontinuous dimension numbers in the engineering drawing by inputting numerical text data manually, then the dimension numbers in the engineering drawing can be extracted. However, because there may be hundreds or even thousands of these dimension numbers in a large engineering drawing, it is difficult and inefficient for the users to search for the dimension numbers one by one.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

In general, the word module, as used herein, refers to logic embodied in hardware or firmware, or to a collection of software instructions, written in a programming language, such as, Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable medium include CDs, DVDs, BLU-RAY, flash memory, and hard disk drives.

Figure 1:
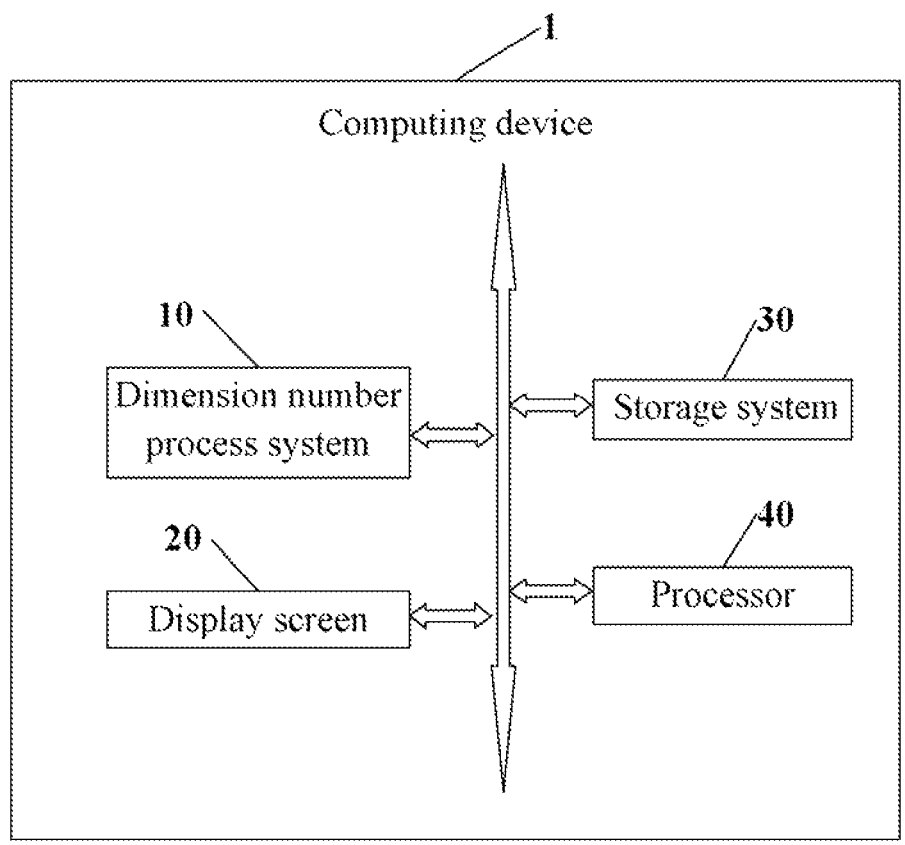
FIG. 1 is a block diagram of one embodiment of a computing device.

FIG. 1 is a block diagram of one embodiment of a computing device 1. The computing device 1 includes a dimension number process system 10, a display screen 20, a storage system 30, and at least one processor 40. The computing device 1 may further include drawing software (not shown in FIG. 1), such as a Computer Aided Design (CAD) software, for example. The display screen 20 displays data of the computing device 1, such as, engineering drawings of workpieces designed by the drawing software of the computing device 1. In one embodiment, the engineering drawing includes a plurality of dimension numbers and dimension frames for labeling dimensions data of the workpiece. All the dimension frames in the engineering drawing have a same size and a same shape, and a same dimension number in different dimension frames also have a same size and a same shape.

The storage system 30 stores data of the computing device 1, such as, the engineering drawings, for example. The at least one processor 40 executes one or more computerized codes and other applications of the computing device 1, to provide functions of the dimension number process system 10. The dimension number process system 10 replaces discontinuous dimension numbers in the engineering drawing with predetermined data, and assists an extraction of the dimension numbers from the engineering drawing to be efficient and convenient. Details will be described as follows.

Figure 2:
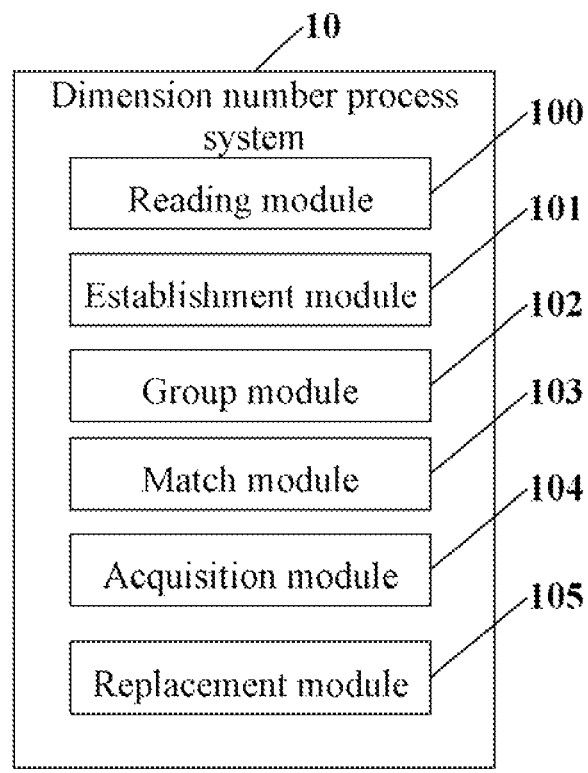
FIG. 2 is a block diagram of one embodiment of a dimension number process system in the computing device of FIG. 1.

FIG. 2 is a block diagram of one embodiment of a dimension number process system in the computing device of FIG. 1. In the embodiment, the dimension number process system 10 may include a reading module 100, an establishment module 101, a group module 102, a match module 103, an acquisition module 104, and a replacement module 105. The modules 100-105 comprise computerized codes in the form of one or more programs that are stored in the storage system 30. The computerized codes include instructions that are executed by the at least one processor 40 to provide functions for the modules. Details of each of the modules will be given in FIG. 3, FIG. 4, FIG. 5, and FIG. 6.

Figure 3:
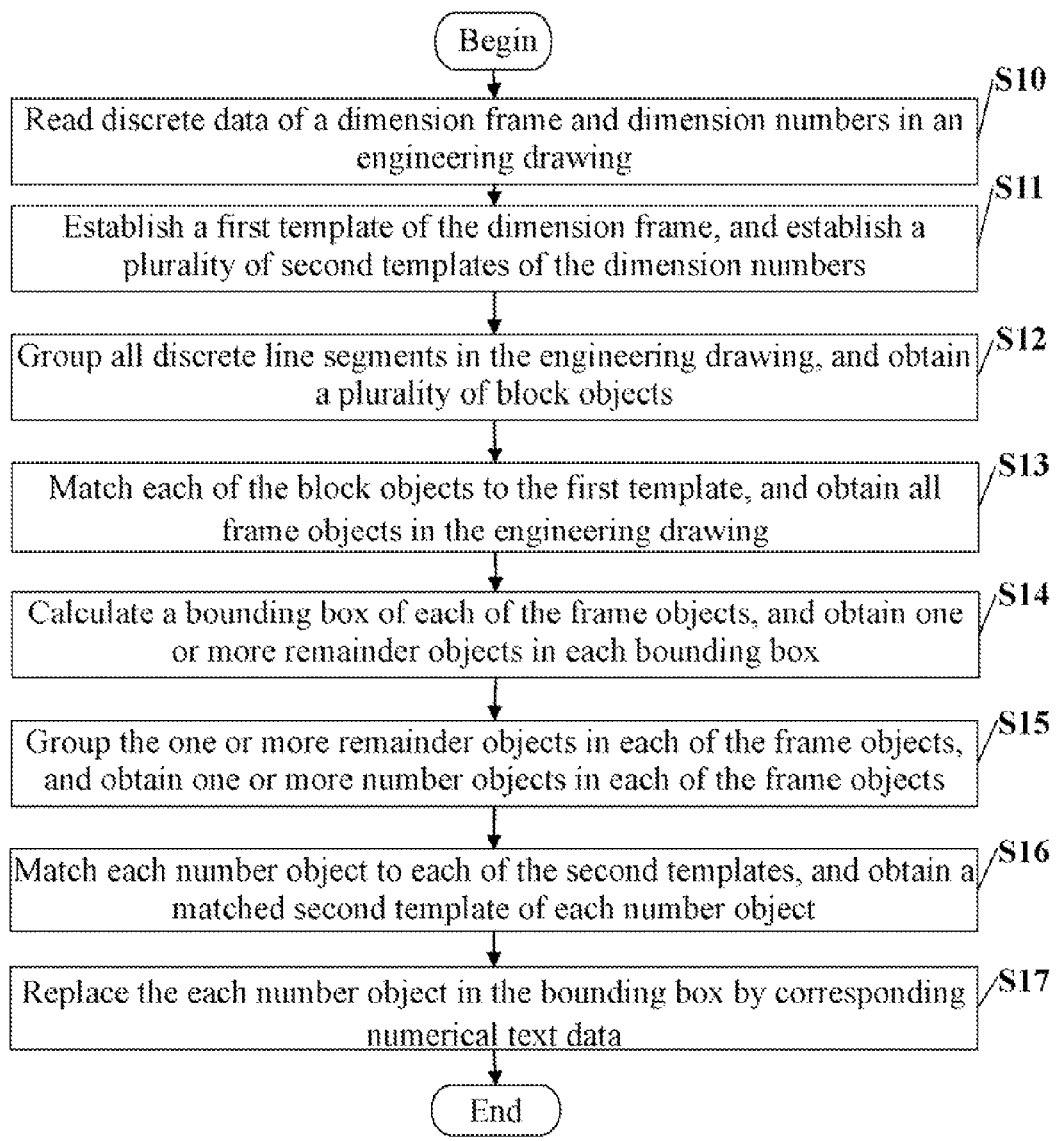
FIG. 3 is a flowchart of one embodiment of a method for processing dimension numbers using the computing device of FIG. 1.

FIG. 3 is a flowchart of one embodiment of a method for processing dimension numbers using the computing devices 1 of FIG. 1. Depending on the embodiment, additional steps may be added, others deleted, and the ordering of the steps may be changed.

Figure 4A:
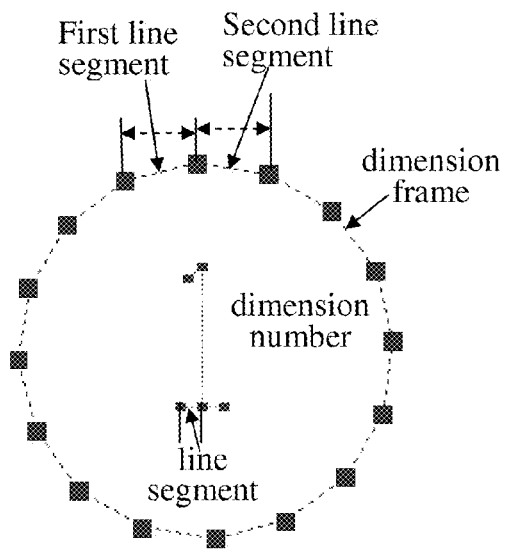
FIG. 4A, FIG. 4B, FIG. 4C and FIG. 4D are schematic diagrams of a first template of a dimension frame and text data of a dimension number.
Figure 4B:
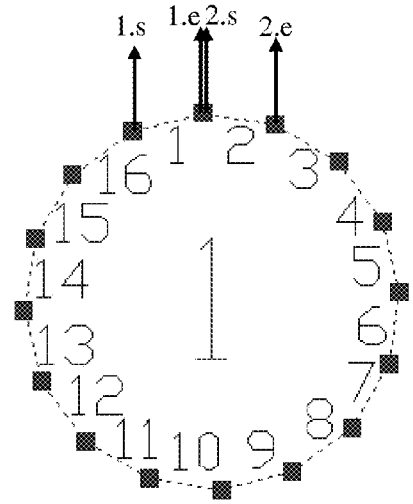
Figure 4C:
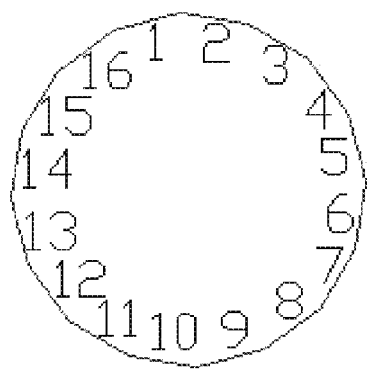

In step S10, the reading module 100 loads an engineering drawing of a workpiece from the storage system 30, displays the engineering drawing on the display screen 20, and reads discontinuous data of a selected dimension frame and selected dimension numbers in the engineering drawing. In one embodiment, the dimension numbers may include 0 to 9, and may be selected in a plurality of dimension frames of the engineering drawing. In FIG. 4A, one of the dimension frames and one of the dimension numbers in the dimension frame are shown. The circle part in FIG. 4A is the dimension frame, and the number "1" in the circle is the dimension number. In one embodiment, both of the dimension frame and the dimension numbers include discontinuous line segments. For example, in FIG. 4A, a first line segment and a second line segment of the dimension frame is shown, and a line segment of the dimension number is shown. As shown in FIG. 4A and FIG. 4B, the first line segment has two control points (two endpoints) "1.s" and "1.e", and the second segment has the two control points "2.s" and "2.e". Although the first line segment seems to connect to the second line segment, that is, the control point "1.e" and the control point "2.s" looks like a same point, there is a small distance between the control point "1.e" and the control point "2.s", and the coordinates of the control point "1.e" are different from the coordinates of the control point "2.s", that is, the two line segments are discontinuous.

In step S11, the establishment module 101 establishes a first template of the selected dimension frame and a plurality of second templates of the dimension numbers 0-9, according to the read discontinuous data, and further establishes a numerical text data of each of the second templates. In detail, the first template is established according to a size and a shape of the dimension frame in the engineering drawing. The first template includes a plurality of continuous line segments of the dimension frame and coordinates of the control points of each of the line segments. For example, if the dimension frame in FIG. 4B including 16 discontinuous line segments is read, the first template in FIG. 4C including 16 continuous line segments is established. In one embodiment, the establishment module 101 establishes the first template and second templates according to a predetermined preference coordinate system, and each of the first template and second templates has an own central position "CenR" including x-coordinate and y-coordinate (CenR[x] CenR[y]). Each central position is determined according to all control points of each of the first template and second templates.

During the step S11, the establishment module 101 sets coordinates of two adjacent control points in discontinuous line segments of the dimension frame to be same, and establishes the first template including the continuous line segments. The two adjacent control points represent a distance between the two adjacent control points are less than a predetermined distance tolerance (e.g. 0.0000001). In one embodiment, the establishment module 101 may modify original coordinates of one of the two adjacent control points to be the same as the coordinates of the other adjacent control point. The establishment module 101 also may sum the original coordinates of the two adjacent control points to get sum coordinates, and determine an average coordinates of the sum coordinates as new coordinates of the two adjacent control points. In other embodiments, the establishment module 101 may set the coordinates of the two adjacent control points to be same by changing precision of decimal points of the coordinates.

Figure 4D:

Furthermore, in step S11, each of the second templates of the dimension numbers is established according to a size and a shape of each of the dimension numbers in the engineering drawing. Each of the second templates includes a plurality of continuous line segments of each of the dimension numbers and coordinates of the control points of each of the continuous line segments. As above-mentioned, the method of establishing the second templates is the same as the method of establishing the first template. In one embodiment, if a dimension number "1" in the dimension frame is read in FIG. 4A, the establishment module 101 establishes the second template of the dimension number "1", and establishes the numerical text data of each of the second template of the dimension number "1". The numerical text data is shown in FIG. 4D.

In step S12, the group module 102 groups all discontinuous line segments in the engineering drawing, and obtains a plurality of block objects. In one embodiment, all discontinuous line segments not only include the above-mentioned dimension frame and dimension numbers in the dimension frames but also include numbers outside of the dimension frames. The group module 102 groups all the discontinuous line segments by the following steps. The group module 102 traverses control points of all the discontinuous line segments and calculates a distance between discretional two control points. If the distance between the discretional two control points is less than the distance tolerance, that is, the discretional two control points are the two adjacent control points, the group module 102 divides two discontinuous line segments including the two adjacent control points into a group, sets coordinates of the two adjacent control points in each group to be same, and obtains each group as a block object. For example, the group module 102 groups the discontinuous line segments in FIG. 4A, and obtains two block objects shown in FIG. 5A and FIG. 5B.

Figure 5A:
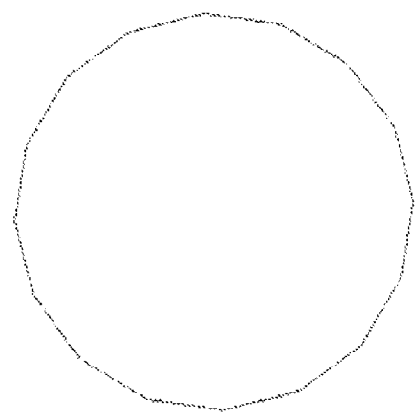
FIG. 5A, FIG. 5B, FIG. 5C and FIG. 5D are schematic diagrams of a frame object and a discontinuous dimension number in the frame object.
Figure 5B:
Figure 5C:
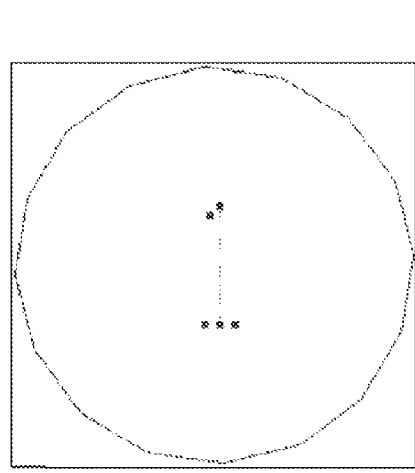
Figure 5D:
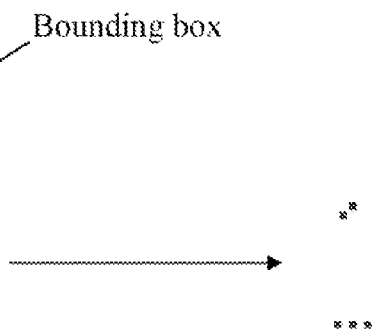

In step S13, the match module 103 matches each of the block objects with the first template, and obtains all frame objects in the engineering drawing. In one embodiment, the match module 103 aligns and contrasts each of the block objects to the first template according to a Newton iteration method, and determines whether each of the block objects matches the first template. If the block object is matched with the first template, the block object is determined to be a frame object. For example, the match module 103 matches the two block objects in FIG. 5A and FIG. 5B with the first template, and determines that the block object in FIG. 5A matches the first template, that is, the block object in FIG. 5A is determined to be the frame object. Details of matching each of the block objects with the first template are described in the FIG. 6.

In step S14, the acquisition module 104 calculates a bounding box of each of the frame objects, and obtains one or more remainder objects in each bounding box. The remainder objects represent other discontinuous line segments in each of the frame objects, that is, one or more dimension numbers including the discontinuous line segments in each of the frame objects are obtained. The acquisition module 104 calculates the bounding box by obtaining a minimum value of X coordinate values (hereinafter referred to as "pt1Min[x]"), a maximum value of X coordinate values (hereinafter referred to as "pt1Max[x]"), a minimum value of Y coordinate values (hereinafter referred to as "pt1Min[y]"), and a maximum value of Y coordinate values (hereinafter referred to as "pt1Max[y]") from all coordinates of each of the frame objects. The bounding box is confirmed according to four vertices including (pt1Min[x], pt1Min[y]), (pt1Min[x], pt1Max[y]), (pt1Max[x], pt1Max[y]), and (pt1Max[x], pt1Min[y]). For example, if the frame object in FIG. 5A is obtained, the acquisition module 104 calculates the bounding box of the frame object shown in FIG. 5C, and obtains the discontinuous data of dimension number "1" in the frame object shown in FIG. 5D.

In step S15, the group module 102 groups the one or more remainder objects in each bounding box of each of the frame objects, and obtains one or more number objects in each of the frame objects. The method of grouping the one or more remainder objects is the same as the method of grouping all discontinuous line segments in paragraph [0018].

In step S16, the match module 103 matches each of the one or more number objects with each of the second templates, and obtains a matched second template of each of the number objects. The method of matching the number objects with each of the second templates is the same as the method of matching the block objects with the first template. Details of matching the number objects with each of the second templates are described in the FIG. 6.

In step S17, the replacement module 105 replaces the number objects in each of the frame objects by corresponding numerical text data, according to the matched second template of each of the number objects and the numerical text data of each of the second templates.

Figure 6:
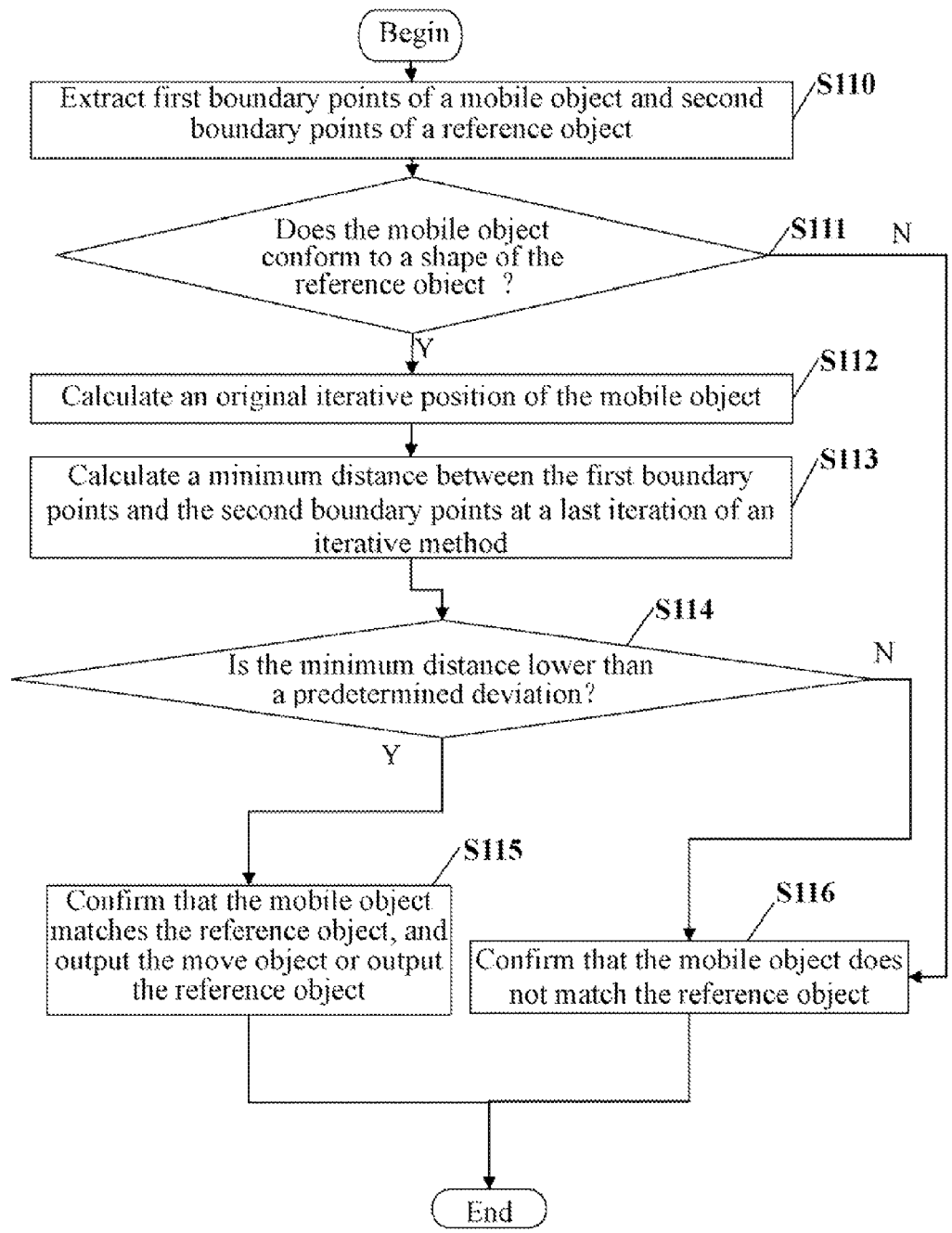
FIG. 6 is a flowchart of one embodiment of matching block objects and number objects.

FIG. 6 is a flowchart of one embodiment of matching block objects and the number objects. For simplification, each of the block objects and each of the number objects are considered as a mobile object, both the first template and each of the second template are considered as a reference object. Detailed descriptions are provided below.

In step S110, the match module 103 extracts first boundary points of the mobile object and second boundary points of the reference object. The first boundary points are extracted by extracting control points having different coordinates of line segments of the mobile object, and the second boundary points are extracted by extracting control points having different coordinates of line segment of the reference object. That is, if there are two control points having the same coordinates, only one of the control points is extracted.

In step S111, the match module 103 determines whether the mobile object conforms to a shape of the reference object, according to a first number of the first boundary points and a second number of the second boundary points. In one embodiment, if the first number is different from the second number, the match module 103 determines that the mobile object does not conform to the shape of the reference object, that is, the mobile object does not match the reference object, then step S116 is implemented. If the first number is the same as the second number, the match module 103 determines that the mobile object conforms to the shape of the reference object, then step S112 is implemented.

In step S112, the match module 103 calculates an original iterative of the mobile object. The initial iterative position is calculated by: calculating a center position CenM (CenM[x], CenM[y]) of the mobile object according to the numbers and coordinates of the first boundary points; calculating the original iterative position P including P[0]=cenM[x]−cenR[x], P[1]=cenM[y]−cenR[y], P[3]=angleX, and P[4]=angleY, according to the CenM of the mobile object and the CenR of the reference object. The angleX represents an angle between a line joining the point cenM and the point cenR and the positive direction of x-axis. The angleY represents an angle between a line joining the point cenM and the point cenR and the positive direction of the y-axis.

In step S113, the match module 103 calculates a minimum distance between the first boundary points and the second boundary points at a last iteration of an iterative method, according to a predetermined iterative formula and the original iterative position. In one embodiment, for simplification, "n" represents a current number of obtained points at each iteration, "n" is an integer and greater than 1. The iterative method includes the following steps. First step, the match module 103 uniformly obtains points in the first boundary points according to a first proportion (e.g. 4:1) at a first iteration, then "n" equals a total number of the first boundary point multiplied by ¼. If there is a second iteration, the match module 103 uniformly obtains points in the first boundary points according to a second proportion (e.g. 2:1), then "n" equals a total number of the first boundary point multiplied by ½. If there is a third iteration, the match module 103 uniformly obtains all the first boundary points for the iteration. Second step, the match module 103 calculates the minimum distance between the first boundary points and the second boundary points at each iteration according to "n" and a virtual position of the mobile object, according to the predetermined iterative formula of $$f(x) = \text{Min}\sqrt{\sum_{n=1}^{n}\left(\sqrt{(X2-X1)^2+(Y2-Y1)^2}\right)/n}.$$

The virtual position (called virtual position 1 here) of the mobile object is determined according to the original iterative position of mobile device and the points obtained at the first iterative. At the second iteration, the virtual position (called virtual position 2 here) of the mobile object is determined according to the points obtained at the second iterative and the virtual position 1 of mobile object. In the above-mentioned formula, (X2,Y2) represents coordinates of each obtained points at each iteration. (X1,Y1) represents coordinates of a nearest point in the second boundary points, and the nearest point has a closest distance to the point (X2,Y2).

Step S113 includes the following sub-steps for calculating the minimum distance. Sub-step one, if f(x) at the first iteration is lower than a predetermined aligning accuracy FunX, f(x) is determined to be the minimum distance, then the procedure ends. Sub-step two, if f(x) at the first iteration is greater than or equal to the FunX, a descent direction of f(x) is calculated according to a predetermined method of Quasi-Newton iterative method. The descent direction of f(x) is a direction toward which the value of f(x) decreases. If the descent direction of f(x) does not exist, f(x) is determined to the minimum distance and the procedure ends. Sub-step three, if the descent direction of f(x) exists, a distance f(x)' between the first boundary points after being moved an predetermined aligning step D along the descent direction and the second boundary points. A method of calculating f(x)' is the same as the method of calculating f(x). Sub-step four, if f(x)' is lower than f(x), then the procedure returns to sub-step two. Otherwise, if f(x)' is greater than or equal to f(x), the procedure returns to sub-step three to calculate the f(x)' between the first boundary points after moving the predetermined aligning step D for the second time along the descent direction and the second boundary points.

In step S114, the match module 103 determines whether the minimum distance is lower than a predetermined deviation. If the minimum distance is lower than the predetermined deviation, step S115 is implemented. Otherwise, if the minimum distance is greater than or equal to the predetermined deviation, step S116 is implemented.

In step S115, the match module 103 confirms that the mobile object matches the reference object, and outputs the mobile object or obtains the reference object matching the mobile object, the procedure ends. In one embodiment, when the mobile object is the block object, if the block object matches the first template, the match module 103 outputs the block object, and then matches a next block object until all the block objects have been matched. If the mobile object is the number object and the number object matches one of the second templates, the match module 103 obtains a matched second template of the number object, and matches a next number object in each frame object until all the matched second templates of the number objects in each frame object have been obtained.

In step S116, the match module 103 confirms that the mobile object does not match the reference object. In one embodiment, if the mobile object is the block object and the block object does not match the first template, the match module 103 matches the next block object until all the block objects have been matched. If the mobile object is the number object, and the number object does not match one of the second templates, the match module 103 matches the number object to a next one of the second templates until the matched second template of the number object is obtained.

All of the processes described above may be embodied in, and be fully automated via, functional code modules executed by one or more general-purpose processors. The code modules may be stored in any type of non-transitory readable medium or other storage device. Some or all of the methods may alternatively be embodied in specialized hardware. Depending on the embodiment, the non-transitory readable medium may be a hard disk drive, a compact disc, a digital video disc, a tape drive or other suitable storage medium.

The described embodiments are merely possible examples of implementations, and have been set forth for a clear understanding of the principles of the present disclosure. Many variations and modifications may be made without departing substantially from the spirit and principles of the present disclosure. All such modifications and variations are intended to be included herein within the scope of this disclosure and the described inventive embodiments, and the present disclosure is protected by the following claims.

What is claimed is:

1. A computer-implemented method for processing dimension numbers using a computing device, the method comprising:
   (a) loading an engineering drawing of a workpiece from a storage system of the computing device, and reading discontinuous data of a selected dimension frame and dimension numbers comprising 0 to 9 in the engineering drawing;
   (b) establishing a first template of the selected dimension frame and a plurality of second templates of the dimension numbers according to the discontinuous data, and establishing a numerical text data of each of the second templates;
   (c) obtaining a plurality of block objects by grouping all discontinuous line segments in the engineering drawing;
   (d) obtaining all frame objects in the engineering drawing by matching each of the block objects with the first template;
   (e) calculating a bounding box of each of the frame objects, and obtaining the discontinuous line segments in each bounding box except the discontinuous line segments of each of the frame objects corresponding to the bounding box as one or more remainder objects in each bounding box, the one or more remainder objects representing the discontinuous data of one or more dimension numbers in each of the frame objects;
   (f) obtaining one or more number objects in each of the frame objects by grouping the one or more remainder objects in each bounding box;
   (g) obtaining a matched second template of each of the number objects by matching each of the number objects with each of the second templates; and
   (h) replacing the one or more number objects in each of the frame objects by corresponding numerical text data, according to the matched second template of each of the number objects and the numerical text data of each of the second templates.

2. The method as claimed in claim 1, wherein the first template is established according to a size and a shape of the selected dimension frame in the engineering drawing, and the first template comprises a plurality of continuous line segments of the selected dimension frame and coordinates of endpoints of each of the continuous line segments; and
   each of the second templates of the dimension numbers is established according to a size and shape of each of the dimension numbers in the engineering drawing, and each of the second templates comprises a plurality of continuous line segments of each of the dimension numbers and coordinates of the endpoints of each of the continuous line segments.

3. The method as claimed in claim 2, wherein the first template comprising the continuous line segments is established by setting coordinates of two adjacent endpoints in discontinuous line segments of the selected dimension frame to be the same, and the two adjacent endpoints representing a distance between two endpoints being lower that a predetermined distance tolerance; and
each of the second templates comprising the continuous line segments is established by setting coordinates of the two adjacent endpoints in discontinuous line segments of each of the dimension numbers to be same.

4. The method as claimed in claim 3, wherein step (c) further comprises:
   (c1) traversing endpoints of all the discontinuous line segments and calculating a distance between discretional two endpoints;
   (c2) dividing two discontinuous line segments comprising two adjacent endpoints into a group, the distance of the two adjacent endpoints being lower than a predetermined distance tolerance;
   (c3) setting coordinates of the two adjacent endpoints in each group to be the same; and
   (c4) obtaining continuous line segments in each group as a block object, and executing step (c2) to step (c3) repeatedly until all the endpoints of all the discontinuous line segments have been traversed.

5. The method as claimed in claim 4, wherein step (d) further comprises:
   (d1) extracting first boundary points of one of the block objects by extracting endpoints having different coordinates in the block object, and extracting second boundary points of the first template by extracting endpoints having different coordinates in the first object;
   (d2) determining whether the block object conforms to a shape of the first template, according to a first number of the first boundary points and a second number of the second boundary points;
   (d3) returning to step (d1) until all the block objects have been matched, upon the condition that the block object does not conform to the shape of the first template, or calculating an original iterative position of the block object according to a first central position of the block object and a second central position of the first template, upon the condition that the block object conforms to the shape of the first template;
   (d4) calculating a minimum distance between the first boundary points and the second boundary points at a last iteration of an iterative method, according to a predetermined iterative formula and the original iterative position; and
   (d5) confirming that the block object matches the first template, and outputting the block object upon the condition that the minimum distance is lower than a predetermined deviation, or confirming that the block object does not match the first template, upon the condition that the minimum distance is greater than or equal to the predetermined deviation, and returning to step (d1).

6. The method as claimed in claim 4, wherein step (g) further comprises:
   (g1) extracting third boundary points of one of the number objects by extracting endpoints having different coordinates in the number object,
   (g2) extracting fourth boundary points of one of the second template by extracting endpoints having different coordinates in the one of the second templates;
   (g3) determining whether the number object conforms to a shape of one of the second templates, according to a third number of the third boundary points and a fourth number of the fourth boundary points;
   (g4) returning to step (g2) until one of the second templates is matched to the number object have been obtained, upon the condition that the number object does not conform to the shape of one of the second templates, or calculating an original iterative position of the number object according to a third central position of the number object and a fourth central position of one of the second templates, upon the condition that the number object conforms to the shape of one of the second templates;

(g5) calculating a minimum distance between the third boundary points and the fourth boundary points at a last iteration of an iterative method, according to the predetermined iterative formula and the original iterative position; and (g6) confirming that the number object matches one of the second templates, and outputting the matched second template of the number object upon the condition that the minimum distance is lower than a predetermined deviation, and returning to step (g1) until the matched second templates of all the number objects in each frame object have been obtained; or confirming that the number object does not match one of the second templates, upon the condition that the minimum distance is greater than or equal to the predetermined deviation, and returning to step (g2).

7. A non-transitory computer readable storage medium storing a set of instructions, when executed by at least one processor of a computing device, cause the at least one processor to perform a method for processing dimension numbers using the computing device, the method comprising:

(a) loading an engineering drawing of a workpiece from a storage system of the computing device, and reading discontinuous data of a selected dimension frame and dimension numbers comprising 0 to 9 in the engineering drawing;

(b) establishing a first template of the selected dimension frame and a plurality of second templates of the dimension numbers according to the discontinuous data, and establishing a numerical text data of each of the second templates;

(c) obtaining a plurality of block objects by grouping all discontinuous line segments in the engineering drawing;

(d) obtaining all frame objects in the engineering drawing by matching each of the block objects with the first template;

(e) calculating a bounding box of each of the frame objects, and obtaining the discontinuous line segments in each bounding box except the discontinuous line segments of each of the frame objects corresponding to the bounding box as one or more remainder objects in each bounding box, the one or more remain objects representing the discontinuous data of one or more dimension numbers in each of the frame objects;

(f) obtaining one or more number objects in each of the frame objects by grouping the one or more remainder objects in each bounding box;

(g) obtaining a matched second template of each of the number objects by matching each of the number objects with each of the second templates;

(h) replacing the one or more number objects in each of the frame objects by corresponding numerical text data, according to the matched second template of each of the number objects and the numerical text data of each of the second templates.

8. The non-transitory computer readable storage medium as claimed in claim 7, wherein the first template is established according to a size and a shape of the selected dimension frame in the engineering drawing, and the first template comprises a plurality of continuous line segments of the selected dimension frame and coordinates of endpoints of each of the continuous line segments; and each of the second templates of the dimension numbers is established according to a size and a shape of each of the dimension numbers in the engineering drawing, and each of the second templates comprises a plurality of continuous line segments of each of the dimension numbers and coordinates of the endpoints of each of the continuous line segments.

9. The non-transitory computer readable storage medium as claimed in claim 8, wherein the first template comprising the continuous line segments is established by setting coordinates of two adjacent endpoints in discontinuous line segments of the selected dimension frame to be same, and the two adjacent endpoints representing a distance between two endpoints being lower that a predetermined distance tolerance; and each of the second templates comprising the continuous line segments is established by setting coordinates of the two adjacent endpoints in discontinuous line segments of each of the dimension numbers to be same.

10. The non-transitory computer readable storage medium as claimed in claim 7, wherein step (c) further comprises:

(c1) traversing endpoints of all the discontinuous line segments and calculating a distance between discretional two endpoints;

(c2) dividing two discontinuous line segments comprising two adjacent endpoints into a group;

(c3) setting coordinates of the two adjacent endpoints in each group to be same; and (c4) obtaining continuous line segments in each group as a block object, and executing step (c2) to step (c3) repeatedly until all the endpoints of all the discontinuous line segments have been traversed.

11. The non-transitory computer readable storage medium as claimed in claim 10, wherein step (d) further comprises:

(d1) extracting first boundary points of the block object by extracting endpoints having different coordinates in the block object, and extracting second boundary points of the first template by extracting endpoints having different coordinates in the first object;

(d2) determining whether the block object conforms to a shape of the first template, according to a first number of the first boundary points and a second number of the second boundary points;

(d3) returning to the step (d1) until all the block objects have been matched, upon the condition that the block object does not conform to the shape of the first template, or calculating an original iterative position of the block object according to a first central position of the block object and a second central position of the first template, upon the condition that the block object conforms to the shape of the first template;

(d4) calculating a minimum distance between the first boundary points and the second boundary points at a last iteration of an iterative method, according to a predetermined iterative formula and the original iterative position;

(d5) confirming that the block object matches the first template, and outputting the block object upon the condition that the minimum distance is lower than a predetermined deviation, or confirming that the block object does not match the first template, upon the condition that the minimum distance is greater than or equal to the predetermined deviation, and returning to the step (d1).

12. The non-transitory computer readable storage medium as claimed in claim 10, wherein step (g) further comprises:

(g1) extracting third boundary points of the number object by extracting endpoints having different coordinates in the number object, (g2) extracting fourth boundary points of one of the second template by extracting endpoints having different coordinates in the one of the second templates;

(g3) determining whether the number object conforms to a shape of one of the second templates, according to a third number of the third boundary points and a fourth number of the fourth boundary points;

(g4) returning to the step (g2) until one of the second templates matched to the number object have been obtained, upon the condition that the number object does not conform to the shape of one of the second templates, or calculating an original iterative position of the number object according to a third central position of the number object and a fourth central position of one of the second templates, upon the condition that the number object conforms to the shape of one of the second templates;

(g5) calculating a minimum distance between the third boundary points and the fourth boundary points at a last iteration of an iterative method, according to the predetermined iterative formula and the original iterative position;

(g6) confirming that the number object matches one of the second templates, and outputting the matched second template of the number object upon the condition that the minimum distance is lower than a predetermined deviation, and returning to the step (g1) until the matched second templates of all the number objects in each frame object have been obtained; or confirming that the number object does not match one of the second templates, upon the condition that the minimum distance is greater than or equal to the predetermined deviation, and returning to the step (g2).

13. A computing device, comprising:

a storage system;

at least one processor; and one or more programs that are stored in the storage system and executed by the at least one processor, the one or more programs comprising:

a reading module that loads an engineering drawing of a workpiece from the storage system, and reads discontinuous data of a selected dimension frame and dimension numbers comprising 0 to 9 in the engineering drawing;

an establishment module that establishes a first template of the selected dimension frame and a plurality of second templates of the dimension numbers according to the discontinuous data, and establishing a numerical text data of each of the second templates;

a group module that obtains a plurality of block objects by grouping all discontinuous line segments in the engineering drawing;

a match module that obtains all frame objects in the engineering drawing by matching each of the block objects with the first template;

an acquisition module that calculates a bounding box of each of the frame objects, and obtains the discontinuous line segments in each bounding box except the discontinuous line segments of each of the frame objects corresponding to the bounding box as one or more remainder objects in each bounding box, the one or more remain objects representing the discontinuous data of one or more dimension numbers in each of the frame objects;

the group module further obtains one or more number objects in each of the frame objects by grouping the one or more remainder objects in each bounding box;

the match module further obtains a matched second template of each of the number objects by matching each of the number objects with each of the second templates; and a replacement module that replaces the one or more number objects in each of the frame objects by corresponding numerical text data, according to the matched second template of each of the number objects and the numerical text data of each of the second templates.

14. The computing device as claimed in claim 13, wherein the establishment module establishes the first template according to a size and a shape of the selected dimension frame in the engineering drawing, and the first template comprises a plurality of continuous line segments of the selected dimension frame and coordinates of endpoints of each of the continuous line segments; and the establishment module establishes each of the second templates of the dimension numbers according to a size and a shape of each of the dimension numbers in the engineering drawing, and each of the second templates comprises a plurality of continuous line segments of each of the dimension numbers and coordinates of the endpoints of each of the continuous line segments.

15. The computing device as claimed in claim 13, wherein the first template comprising the continuous line segments is established by setting coordinates of two adjacent endpoints in discontinuous line segments of the selected dimension frame to be same, and the two adjacent endpoints representing a distance between two endpoints being lower that a predetermined distance tolerance; and each of the second templates comprising the continuous line segments is established by setting coordinates of the two adjacent endpoints in discontinuous line segments of each of the dimension numbers to be same.

16. The computing device as claimed in claim 13, wherein the group module obtaining the block objects comprises:

(c1) traversing endpoints of all the discontinuous line segments and calculating a distance between discretional two endpoints;

(c2) dividing two discontinuous line segments comprising two adjacent endpoints into a group;

(c3) setting coordinates of the two adjacent endpoints in each group to be same; and (c4) obtaining continuous line segments in each group as a block object, and executing step (c2) to step (c3) repeatedly until all the endpoints of all the discontinuous line segments have been traversed.

17. The computing device as claimed in claim 16, wherein the match module match each of the block objects with the first template by following steps:

(d1) extracting first boundary points of the block object by extracting endpoints having different coordinates in the block object, and extracting second boundary points of the first template by extracting endpoints having different coordinates in the first object;

(d2) determining whether the block object conforms to a shape of the first template, according to a first number of the first boundary points and a second number of the second boundary points;

(d3) returning to step (d1) until all the block objects have been matched, upon the condition that the block object does not conform to the shape of the first template, or calculating an original iterative position of the block object according to a first central position of the block object and a second central position of the first template, upon the condition that the block object conforms to the shape of the first template;

(d4) calculating a minimum distance between the first boundary points and the second boundary points at a last iteration of an iterative method, according to a predetermined iterative formula and the original iterative position;

(d5) confirming that the block object matches the first template, and outputting the block object upon the condition that the minimum distance is lower than a predetermined deviation, or confirming that the block object does not match the first template, upon the condition that the minimum distance is greater than or equal to the predetermined deviation, and returning to step (d1).

18. The computing device as claimed in claim 13, wherein the match module match each of the one or more number objects with each of the second templates by the following steps:

(g1) extracting third boundary points of the number object by extracting endpoints having different coordinates in the number object, (g2) extracting fourth boundary points of one of the second template by extracting endpoints having different coordinates in the one of the second templates;

(g3) determining whether the number object conforms to a shape of one of the second templates, according to a third number of the third boundary points and a fourth number of the fourth boundary points;

(g4) returning to step (g2) until one of the second templates matched to the number object have been obtained, upon the condition that the number object does not conform to the shape of one of the second templates, or calculating an original iterative position of the number object according to a third central position of the number object and a fourth central position of one of the second templates, upon the condition that the number object conforms to the shape of one of the second templates;

(g5) calculating a minimum distance between the third boundary points and the fourth boundary points at a last iteration of an iterative method, according to the predetermined iterative formula and the original iterative position;

(g6) confirming that the number object matches one of the second templates, and outputting the matched second template of the number object upon the condition that the minimum distance is lower than a predetermined deviation, and returning to step (g1) until the matched second templates of all the number objects in each frame object have been obtained; or confirming that the number object does not match one of the second templates, upon the condition that the minimum distance is greater than or equal to the predetermined deviation, and returning to step (g2).

* * * * *